United States Patent
Sugita et al.

(10) Patent No.: US 10,696,869 B2
(45) Date of Patent: Jun. 30, 2020

(54) POLISHING COMPOSITION

(71) Applicant: NITTA HAAS INCORPORATED, Osaka-shi, Osaka (JP)

(72) Inventors: Noriaki Sugita, Kyotanabe (JP); Shuhei Matsuda, Kyotanabe (JP); Takayuki Matsushita, Kyotanabe (JP); Mika Tazuru, Kyotanabe (JP)

(73) Assignee: NITTA HAAS INCORPORATED, Osaka (JP)

( * ) Notice: Subject to any disclaimer, the term of this patent is extended or adjusted under 35 U.S.C. 154(b) by 108 days.

(21) Appl. No.: 15/769,934

(22) PCT Filed: Oct. 21, 2016

(86) PCT No.: PCT/JP2016/081307
§ 371 (c)(1),
(2) Date: Apr. 20, 2018

(87) PCT Pub. No.: WO2017/069253
PCT Pub. Date: Apr. 27, 2017

(65) Prior Publication Data
US 2018/0312725 A1   Nov. 1, 2018

(30) Foreign Application Priority Data

Oct. 23, 2015   (JP) .................... 2015-209326

(51) Int. Cl.
| | |
|---|---|
| *C09G 1/02* | (2006.01) |
| *H01L 21/304* | (2006.01) |
| *B24B 37/00* | (2012.01) |
| *H01L 21/02* | (2006.01) |
| *H01L 21/306* | (2006.01) |
| *B24B 37/04* | (2012.01) |

(52) U.S. Cl.
CPC ............. *C09G 1/02* (2013.01); *B24B 37/00* (2013.01); *H01L 21/02024* (2013.01); *H01L 21/304* (2013.01); *H01L 21/30625* (2013.01); *B24B 37/044* (2013.01)

(58) Field of Classification Search
CPC ........................................................ C09G 1/02
USPC ........................................................ 438/693
See application file for complete search history.

(56) References Cited

U.S. PATENT DOCUMENTS

| | | |
|---|---|---|
| 7,687,393 B2 | 3/2010 | Iwasa |
| 2015/0299517 A1 | 10/2015 | Matsushita |

FOREIGN PATENT DOCUMENTS

| | | |
|---|---|---|
| JP | 2012-216723 A | 11/2012 |
| JP | 2014-130958 A | 7/2014 |

OTHER PUBLICATIONS

International Search Report in PCT/JP2016/081307, dated Dec. 6, 2016, 4pp.
Extended European Search Report in EP Application No. 16857566.0, dated Sep. 10, 2018, 6pp.
Office Action in TW Application No. 105134181, dated Apr. 21, 2020. 9pp.

*Primary Examiner* — Roberts P Culbert
(74) *Attorney, Agent, or Firm* — Hauptman Ham, LLP

(57) ABSTRACT

A polishing composition capable of suppressing surface defects and reducing haze is provided. The polishing composition includes: abrasives; at least one water-soluble polymer selected from vinyl alcohol-based resins having a 1,2-diol structural unit; a polyalcohol; and an alkali compound. Preferably, the polishing composition further includes a non-ionic surfactant.

6 Claims, No Drawings

POLISHING COMPOSITION

RELATED APPLICATIONS

The present application is a National Phase of International Application Number PCT/JP2016/081307, filed Oct. 21, 2016, which claims priority to Japanese Application No. 2015-209326 filed Oct. 23, 2015.

TECHNICAL FIELD

The present invention relates to a polishing composition.

BACKGROUND ART

During polishing of a silicon wafer by chemical mechanical polishing (CMP), a polishing process with multiple steps, such as three or four steps, is performed to achieve high-precision planarization. The slurry used for the last polishing step usually contains a water-soluble polymer such as hydroxyethyl cellulose (HEC) or polyvinyl alcohol (PVA).

For example, JP 2012-216723 A discloses a polishing composition containing at least one water-soluble polymer selected from vinyl alcohol-based resins having a 1,2-diol structural unit, and alkali.

DISCLOSURE OF THE INVENTION

Recently, demands have been made for suppressing surface defects with respect to stricter standards and reducing "haze" on the surface.

The present invention was made to solve these problems. An object of the present invention is to provide a polishing composition that can reduce surface defects and haze.

According to an embodiment of the present invention, a polishing composition includes: abrasives; at least one water-soluble polymer selected from vinyl alcohol-based resins having a 1,2-diol structural unit expressed by Formula (1) provided below; a polyalcohol; and an alkali compound.

[Formula 1]

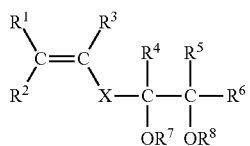

(1)

(In the formula, each of "$R^1$", "$R^2$" and "$R^3$" independently indicates a hydrogen atom or an organic group; "X" indicates a single bond or a joining chain; each of "$R^4$", "$R^5$" and "$R^6$" independently indicates a hydrogen atom or an organic group; and each of "$R^7$" and "$R^8$" independently indicates a hydrogen atom.)

According to an embodiment of the present invention, a polishing composition includes: abrasives; at least one water-soluble polymer selected from vinyl alcohol-based resins having a 1,2-diol structural unit expressed by Formula (1); a polyalcohol; and an alkali compound, thereby suppressing surface defects and reducing haze on the silicon wafer after polishing.

EMBODIMENTS FOR CARRYING OUT THE INVENTION

Embodiments of the present invention will be described in detail.

A polishing composition according to an embodiment of the present invention, COMP1, includes: abrasives; at least one water-soluble polymer selected from vinyl alcohol-based resins having a 1,2-diol structural unit expressed by Formula (1) provided below; a polyalcohol; and an alkali compound.

[Formula 1]

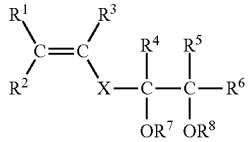

(1)

(In the formula, each of "$R^1$", "$R^2$" and "$R^3$" independently indicates a hydrogen atom or an organic group; "X" indicates a single bond or a joining chain; each of "$R^4$", "$R^5$" and "$R^6$" independently indicates a hydrogen atom or an organic group; and each of "$R^7$" and "$R^8$" independently indicates a hydrogen atom.)

The polishing composition COMP1 is used for polishing silicon.

Abrasives used may be ones that are commonly used in this field and include, for example, colloidal silica, fumed silica, colloidal alumina, fumed alumina and ceria, where colloidal silica and fumed silica are particularly preferable.

The water-soluble polymer expressed by Formula (1) is a modified polyvinyl alcohol (modified PVA). The modified PVA used may be of a highly saponified type or of a lowly saponified type. The modified PVA used may have any degree of polymerization. A single type of the modified PVA may be used, or two or more types of the modified PVA may be used.

Although not limiting, the content of the water-soluble polymer may be, as expressed in percent by weight relative to the total polishing composition (undiluted solution), for example, 0.01 to 1.0 wt %, and preferably 0.03 to 0.7 wt %. It may be, expressed as a proportion relative to one part by weight of abrasives, for example, 0.001 to 0.1 parts by weight, and preferably 0.003 to 0.07 parts by weight.

The polyalcohol is an alcohol including two or more hydroxy groups in one molecule. The polyalcohol may be, for example: a glycoside, having sugar and an organic compound other than sugar in glycosidic linkage; polyalcohol alkylene oxide adduct, having a polyalcohol combined with alkylene oxide; a polyalcohol fatty acid ester, having fatty acid and polyalcohol in ester linkage; glycerine; propylene glycol; or polyethylene glycol. The glycoside may be an alkylene oxide derivative of methylglucoside, expressed in Formula (2) provided below, for example. The polyalcohol alkylene oxide adduct may be, for example, an alkylene oxide adduct with, for example, glycerine, pentaerythritol or ethylene glycol. The polyalcohol fatty acid ester may be, for example, glycerine fatty acid ester, sorbitol fatty acid ester, sorbitan fatty acid ester, or sucrose fatty acid ester. The polyalcohol may be present, for example, in an amount smaller than the amount of the water-soluble polymer.

[Formula 2]

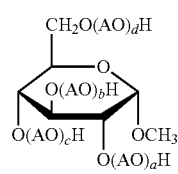

(2)

(In the formula, "AO" indicates alkylene oxide. "a" to "d" each indicate an integer.)

The alkylene oxide derivative of methylglucoside may be, for example, polyoxyethylene methyl glucoside or polyoxypropylene methyl glucoside.

A single type of the polyalcohol may be used, or two or more types of the polyalcohol may be used. To suppress surface defects and reduce haze, it is preferable to use two or more types of polyalcohol combined.

Although not limiting, the content of the polyalcohol (if two or more types of polyalcohol are contained, their total content) may be, as expressed in percent by weight relative to the total polishing composition (undiluted solution), for example, 0.0001 to 0.3 wt %, and preferably 0.001 to 0.1 wt %. It may be, expressed as a proportion relative to one part by weight of abrasives, for example, 0.00001 to 0.03 parts by weight, and preferably 0.0001 to 0.01 parts by weight.

The alkali compound may be, for example, ammonia, a quaternary ammonium salt, potassium hydroxide, sodium hydroxide, potassium hydrogencarbonate, potassium carbonate, sodium hydrogencarbonate, sodium carbonate, ammonium hydrogencarbonate, ammonium carbonate, or an amine compound. The alkali compound may be made of one of these listed compounds, or may be made of two or more of them. The quaternary ammonium salt may be, for example, tetramethylammonium hydroxide, or tetraethylammonium hydroxide.

The amine compound may include an aliphatic amine or heterocyclic amine. More specifically, it may include methylamine, dimethylamine, trimethylamine, ethylamine, diethylamine, triethylamine, propylamine, butylamine, hexylamine, cyclohexylamine, ethylenediamine, hexamethylenediamine, diethylenetriamine, triethylenetetramine, ethanolamine, anhydrous piperazine, piperazine hexahydrate, 1-(2-aminoethyl)piperazine and N-methylpiperazine.

Although not limiting, the content of the alkali compound may be, as expressed in percent by weight relative to the total polishing composition (undiluted solution), for example, 0.001 to 1.0 wt %, and preferably 0.01 to 0.7 wt %. It may be, expressed as a proportion relative to one part by weight of abrasives, for example, 0.0001 to 0.1 parts by weight, and preferably 0.001 to 0.07 parts by weight.

The polishing composition COMP1 may be prepared by mixing at least one water-soluble polymer selected from vinyl alcohol-based resins having a 1,2-diol structural unit expressed by Formula (1), abrasives, polyalcohol and an alkali compound in appropriate amounts and adding water. Alternatively, the polishing composition COMP1 may be prepared by successively mixing abrasives, at least one water-soluble polymer selected from vinyl alcohol-based resins having a 1,2-diol structural unit expressed by Formula (1), polyalcohol and an alkali compound into water. These components may be mixed by a means commonly used in the technical field of polishing composition, such as a monogenizer and ultrasonic waves.

Since the polishing composition COMP1 contains an alkali compound, the pH is adjusted to a range of 8 to 12, for example.

Preferably, the polishing composition COMP1 further includes a non-ionic surfactant. A suitable non-ionic surfactant may be, for example, a diamine compound expressed by General Formula (3) provided below. A diamine compound expressed by General Formula (3) includes an alkylenediamine structure with two nitrogen atoms and has at least one block polyether bonded to the two nitrogen atoms of the alkylenediamine structure, where the block polyether is made of an oxyethylene group and an oxypropylene group bonded together.

[Formula 3]

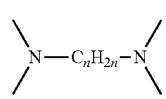

(3)

(In the formula, "n" indicates an integer equal to or larger than 1.)

The diamine compound expressed by Formula (3) may be, for example, N, N, N',N'-tetrakis(polyoxyethylene)(polyoxypropylene)ethylenediamine (i.e., poloxamine). The poloxamine may be expressed by Formula (4) or (5) provided below, for example.

[Formula 4])

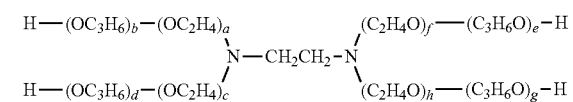

(4)

(In the formula, "a" to "g" each indicate an integer.)

[Formula 5]

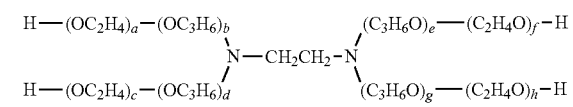

(5)

(In the formula, "a" to "g" each indicate an integer.)

Non-ionic surfactants other than the diamine compound expressed by Formula (3) may be poloxamer, a polyoxyalkylene alkyl ether, a polyoxyalkylene fatty acid ester, or polyoxyalkylenealkylamine.

The polyoxyalkylene alkyl ether may be, for example, polyoxyethylene lauryl ether, polyoxyethylene cetyl ether, or polyoxyethylene stearyl ether. The polyoxyalkylene fatty acid ester may be, for example, polyoxyethylene monolaurate, or polyoxyethylene monostearate. The polyoxyalkylenealkylamine may be, for example, polyoxyethylene lauryl amine, or polyoxyethylene oleylamine.

Although not limiting, the content of the non-ionic surfactant may be, as expressed in percent by weight relative to the total polishing composition (undiluted solution), for example, 0.0001 to 0.3 wt %, and preferably 0.001 to 0.1 wt %. It may be, expressed as a proportion relative to one part by weight of abrasives, for example, 0.00001 to 0.03 parts by weight, and preferably 0.0001 to 0.01 parts by weight.

According to an embodiment of the present invention, the polishing composition COMP1 may further include, for example, a chelating agent and/or an acid substance, as required by the desired characteristics.

The chelating agent may be, for example, an aminocarboxylic acid-based chelating agent or an organophophonate-based chelating agent.

The aminocarboxylic acid-based chelating agent may be, for example, ethylenediamine tetraacetic acid, sodium ethylenediaminetetraacetate, nitrilotriacetic acid, sodium nitrilotriacetate, ammonium nitrilotriacetate, hydroxyethyl ethylenediamine triacetic acid, hydroxyethyl ethylenediamine sodium triacetate, diethylenetriamine pentaacetic acid, diethylenetriamine sodium pentaacetate, triethylenetetramine hexaacetic acid, or triethylenetetramine sodium hexaacetate.

The organophosphonate-based chelating agent may be, for example, 2-aminoethylphophonic acid, 1-hydroxyethylidene-1,1-diphosphonate, aminotri(methylenephosphonic acid), ethylenediaminetetrakis(methylenephosphonic acid), diethylene triaminepenta(methylenephosphonic acid), ethane-1,1,-diphosphonate, ethane-1,1,2-triphosphonic acid, ethane-1-hydroxy-1,1-diphosphonic acid, ethane-1-hydroxy-1,1,2-triphosphonic acid, ethane-1,2-dicarboxy-1,2-diphosphonic acid, methanehydroxyphosphonic acid, 2-phosphonobutane-1,2-dicarboxylic acid, 1-phosphonobutane-2,3,4-tricarboxylic acid, or α-methylphosphono succinic acid.

The acid substance may be, for example, a carboxylate, sulfonate, acidic phosphate ester salt, phosphonate, inorganic acid salt, ethylene oxide adduct of alkylamine, polyalcohol partial ester, or carboxylic acid amide.

The above-illustrated embodiments are merely examples for carrying out the present invention. As such, the present invention is not limited to the above-illustrated embodiments and may be modified as appropriate without departing from the spirit of the invention.

EXAMPLES

The present invention will now be described in detail referring to examples. Specifically, evaluation tests 1 to 9 described below were used.

<Evaluation Test 1> (Inventive Example 1, Comparative Example 1)

The polishing composition Sample1 of Inventive Example 1 was made by mixing 9.5 wt % abrasives (colloidal silica), 0.5 wt % ammonium hydroxide ($NH_4OH$), 0.0135 wt % modified PVA (degree of polymerization: 450) and 0.015 wt % polyalcohol (1) into water, and providing a total of 100 parts by weight.

The average primary particle size of the abrasives used (by the BET method) was 35 nm, and the average secondary particle size was 70 nm. Polyalcohol (1) was polyoxyethylenemethylglucoside, and had a molecular weight of 634.

The polishing composition Sample_CP1 of Comparative Example 1 had the same make-up as Inventive Example 1 except that the amount of modified PVA in the polishing composition of Inventive Example 1 was 0.15 wt % and no polyalcohol (1) was mixed in.

The polishing composition Ref 1 of the reference example was a commercially available polishing composition (NP8020H from Nitta Haas Incorporated).

The above-listed make-up is the make-up before dilution, and is diluted to be used for polishing. The present inventive and comparative examples were used after 20 parts by weight of water was added to each part by weight of the undiluted solution (i.e. diluted 21 times) (the same applies to the subsequent inventive and comparative examples). The polishing composition Ref_1 of the reference example was used throughout, i.e. in Evaluation Test 2 et seq. discussed below.

The components of the polishing compositions of Inventive Example 1, Comparative Example 1 and the reference example are shown in Table 1. In Table 1, the weight percentage for each component indicates the weight percentage relative to the total polishing composition (undiluted solution) (the same applies to Table 2 et seq.).

The polishing compositions of Inventive Example 1, Comparative Example 1 and the reference example were used to perform polishing under the polishing conditions provided below. Then, the number of defects and the haze value were measured.

(Polishing Conditions)

A polishing device (SPP800S from Okamoto Machine Tool Works Ltd.) was used to polish silicon wafers for five minutes, where the polishing compositions of Inventive Example 1 and Comparative Example 1 were supplied at a rate of 600 mL/min onto a polishing pad (SUPREME RN—H from Nitta Haas Incorporated). Each of the silicon wafers used had a diameter of 300 mm and was of a p-type semiconductor, and had the crystal orientation (100). The polishing was performed under the following conditions: the polishing pressure was 0.012 MPa, the rotation speed of the polishing surface plate 40 rpm, and the rotation speed of the carrier 39 rpm.

(Method of Measuring Number of Defects)

For each of Inventive Example 1 and Comparative Example 1, the number of defects was measured using a wafer defect inspection/review device (M5640 of the MAG-ICS series from Lasertec Corporation). The measurement condition was D37 mV. The description of the method of measuring the number of defects also applies to the subsequent inventive and comparative examples.

(Method of Measuring Haze Value)

For each of Inventive Example 1 and Comparative Example 1, the haze value was measured using a wafer surface inspection device (LS6600 from Hitachi Electronics Engineering Co., Ltd.). The description of the method of measuring the haze value also applies to the subsequent inventive and comparative examples.

The results of the measurements of the number of defects and haze value are shown in Table 1. The results of the measurements for Inventive Example 1 and Comparative Example 1 are given as values relative to the results of the measurements of the number of defects and haze value for the reference example, the latter results being represented as 100.

TABLE 1

| Polishing composition | | Inv. Ex. 1 Sample1 | Comp. Ex. 1 Sample_CP1 | Ref. Ex. Ref_1 |
|---|---|---|---|---|
| Composition of undiluted solution of polishing composition | abrasives (colloidal silica) | 9.5 | 9.5 | commercial product NP8020H |
| | alkali ($NH_4OH$) | 0.5 | 0.5 | |

TABLE 1-continued

|  | Polishing composition | Inv. Ex. 1 Sample1 | Comp. Ex. 1 Sample_CP1 | Ref. Ex. Ref_1 |
|---|---|---|---|---|
| (wt %) | water-soluble polymer: modified PVA | 0.135 | 0.15 | |
| | polyalcohol (1) (EO derivative) | 0.015 | — | |
| | polyalcohol (2) (PO derivative) | — | — | |
| | non-ionic surfactant (poloxamine) | — | — | |
| Number of defects | | 19.1 | 39.4 | 100 |
| Haze value | | 113 | 125.3 | 100 |

Evaluation of Inventive Example

A comparison between Inventive Example 1 and Comparative Example 1 reveals that Inventive Example 1, which has some of the content of modified PVA replaced by polyalcohol (1), significantly reduces both the number of defects and haze value. Modified PVA is thought to protect the surface of a wafer and have the function of providing wettability to the surface of the wafer. On the other hand, a polishing composition including both modified PVA and polyalcohol provides a further improved number of defects and haze value presumably because polyalcohol has a smaller molecular weight than modified PVA and thus protects the surface of a wafer with higher density than modified PVA.

<Evaluation Test 2> (Inventive Examples 2 to 3, Comparative Example 2)

The polishing composition Sample2 of Inventive Example 2 was made by mixing 9.5 wt % abrasives (colloidal silica), 0.27 wt % ammonium hydroxide (NH₄OH), 0.07 wt % modified PVA and 0.014 wt % polyalcohol (1) into water, and providing a total of 100 parts by weight.

The polishing composition Sample 3 of Inventive Example 3 had the same make-up as Inventive Example 2 except that polyalcohol (1) mixed into the polishing composition of Inventive Example 2 was replaced by 0.014 wt % polyalcohol (2).

Polyalcohol (2) used in these examples was polyoxypropylenemethylglucoside, and had a molecular weight of 774.

The polishing composition Sample_CP2 of Comparative Example 2 had the same make-up as Inventive Example 2 except that polyalcohol (1) mixed into the polishing composition of Inventive Example 2 was replaced by 0.014 wt % poloxamine.

In these examples, poloxamine was used as an example of non-ionic surfactant. More specifically, the poloxamine used was the reverse poloxamine expressed by Formula (4) provided below. This poloxamine had an EO/PO ratio (weight ratio) of 40/60 and a molecular weight of 6900.

[Formula 4]

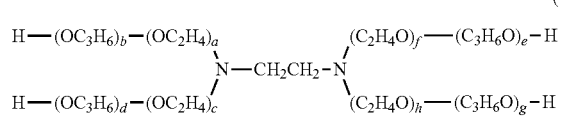

(4)

(In the formula, "a" to "g" each indicate an integer.)

The components of the polishing compositions of Inventive Examples 2 to 3 and Comparative Example 2 are shown in Table 2.

The polishing compositions of Inventive Examples 2 and 3, Comparative Example 2 and the reference example were used to perform polishing under the same polishing conditions as for Inventive Example 1 and Comparative Example 1. Then, the number of defects and the haze value were measured. The results of the measurements of the number of defects and haze value are shown in Table 2. The results of the measurements for Inventive Examples 2 and 3 and Comparative Example 2 are given as values relative to the results of the measurements of the number of defects and haze value for the reference example, the latter results being represented as 100.

TABLE 2

|  |  | Inv. Ex. 2 Sample2 | Inv. Ex. 3 Sample3 | Comp. Ex. 2 Sample_CP2 | Ref. Ex. Ref_1 |
|---|---|---|---|---|---|
| Composition of undiluted solution of polishing composition (wt %) | abrasives (colloidal silica) | 9.5 | 9.5 | 9.5 | commercial product NP8020H |
| | alkali (NH₄OH) | 0.27 | 0.27 | 0.27 | |
| | water-soluble polymer: modified PVA | 0.07 | 0.07 | 0.07 | |
| | polyalcohol (1) (EO derivative) | 0.014 | — | — | |
| | polyalcohol (2) (PO derivative) | — | 0.014 | — | |
| | non-ionic surfactant (poloxamine) | — | — | 0.014 | |
| Number of defects | | 30.4 | 35.9 | 56.9 | 100 |
| Haze value | | 95.9 | 91.2 | 97.7 | 100 |

Evaluation of Inventive Examples

Inventive Examples 2 and 3 and Comparative Example 2 show that Inventive Examples 2 and 3 significantly reduce both the number of defects and haze value compared with Comparative Example 2. This demonstrates that, in a polishing composition containing abrasives, modified PVA, polyalcohol and ammonium hydroxide, the effect of poloxamine of improving surface characteristics is larger than the effect of polyalcohol of improving surface characteristics.

A comparison between Inventive Examples 2 and 3 reveals that Inventive Example 2 containing polyalcohol (1), which is an ethylene oxide derivative, had a lower number of defects than Inventive Example 3 containing polyalcohol (2), which is a propylene oxide derivative. On the other hand, Inventive Example 3 containing polyalcohol (2), which is a propylene oxide derivative had a lower haze value than Inventive Example 2 containing polyalcohol (1), which is an ethylene oxide derivative. That is, it can be seen that an ethylene-based polyalcohol is more effective for the number of defects, and a propylene-based polyalcohol is more effective for haze.

A propylene-based polyalcohol is more effective for haze value than an ethylene-based polyalcohol presumably because of an influence of the difference in the effect of suppressing etching between ethylene-based compounds and propylene-based compounds.

In the past, the present inventors did research on the effect of alkali compounds of suppressing etching and found that propylene-based compounds have larger effects of suppressing etching than ethylene-based compounds. When this finding is applied to polyalcohol, it can be assumed that a propylene-based polyalcohol has a larger effect of suppressing etching than an ethylene-based polyalcohol. That is, with a polishing composition containing a propylene-based polyalcohol, the etching of the surface of the wafer by the polishing composition can progress less easily than with a polishing composition containing an ethylene-based polyalcohol. This is thought to reduce the haze value, which is indicative of the roughness of the surface of the wafer.

An ethylene-based polyalcohol is more effective for the number of defects than a propylene-based polyalcohol presumably because of a direct influence of the degree of adsorption of the polishing composition onto the wafer surface.

Generally, an increase in the adsorption of a polishing composition onto the wafer surface reduces the effect of mechanical polishing. This prevents scratches on the wafer surface caused by mechanical polishing. Further, the polishing composition is adsorbed on the wafer surface to protect the wafer surface, thereby preventing particles from adhering to the surface of the wafer. On the other hand, an increase in the adsorption of the polishing composition onto the surface of the wafer reduces the polishing speed such that forces for removing scratches on the surface of the wafer (particularly, deep scratches on the wafer surface) tend to decrease.

A comparison between a polishing composition containing an ethylene-based compound and a polishing composition containing a propylene-based compound shows that the polishing composition containing a propylene-based compound has a higher adsorption onto the wafer surface. In Evaluation Test 2, it can be assumed that the polishing composition of Inventive Example 3 was adsorbed on the surface of the wafer more strongly than the polishing composition of Inventive Example 2, which reduced polishing speed such that forces for removing deep scratches present on the wafer surface decreased, resulting in a larger number of defects than with Inventive Example 2.

<Evaluation Test 3> (Examples 4 to 6)

The composition Sample4 of Inventive Example 4 had the same make-up as Comparative Example 2 except that 0.0040 wt % polyalcohol (1) was added to the polishing composition of Comparative Example 2.

The composition Sample5 of Inventive Example 5 had the same make-up as Inventive Example 4 except that the amount of polyalcohol (1) of the polishing composition of Inventive Example 4 was changed to 0.0021 wt %.

The composition Sample6 of Inventive Example 6 had the same make-up as Inventive Example 5 except that polyalcohol (1) of the polishing composition of Inventive Example 5 was replaced by 0.0021 wt % polyalcohol (2).

The components of the polishing compositions of Inventive Examples 4 to 6 are shown in Table 3.

The polishing compositions of Inventive Examples 4 to 6 and the reference example were used to perform polishing under the same polishing conditions as Inventive Example 1 and Comparative Example 1. Then, the number of defects and the haze value were measured. The results of the measurements of the number of defects and haze value are shown in Table 3. The results of the measurements for Inventive Examples 4 to 6 are given as values relative to the results of the measurements of the number of defects and haze value for the reference example, the latter results being represented as 100.

TABLE 3

| Polishing composition | | Inv. Ex. 4 Sample4 | Inv. Ex. 5 Sample5 | Inv. Ex. 6 Sample6 | Ref. Ex. Ref_1 |
|---|---|---|---|---|---|
| Composition of undiluted solution of polishing composition (wt %) | abrasives (colloidal silica) | 9.5 | 9.5 | 9.5 | commercial product NP8020H |
| | alkali (NH$_4$OH) | 0.27 | 0.27 | 0.27 | |
| | water-soluble polymer: modified PVA | 0.07 | 0.07 | 0.07 | |
| | polyalcohol (1) (EO derivative) | 0.004 | 0.0021 | — | |
| | polyalcohol (2) (PO derivative) | — | — | 0.0021 | |
| | non-ionic surfactant (poloxamine) | 0.014 | 0.014 | 0.014 | |
| Number of defects | | 14.6 | 15.6 | 22.7 | 100 |
| Haze value | | 94.2 | 98.3 | 94.2 | 100 |

Evaluation of Inventive Examples

Inventive Examples 4 and 5 reveal that, as the amount of polyalcohol (1) contained in the polishing compositions increased from the level in Inventive Example 5 to that in Inventive Example 4, both the number of defects and haze value decreased.

A comparison between Inventive Examples 5 and 6 in which the polishing compositions had poloxamine mixed therein shows that, similar to the comparison between Inventive Examples 2 and 3 in Evaluation Test 2, Inventive Example 5 containing polyalcohol (1), which is an ethylene oxide derivative, provided a smaller number of defects than Inventive Example 6 containing polyalcohol (2), which is a propylene oxide derivative. On the other hand, Inventive Example 6 containing polyalcohol (2), which is a propylene oxide derivative, provided a lower haze value than Inventive Example 5 containing polyalcohol (1), which is an ethylene oxide derivative.

<Evaluation Test 4> (Inventive Examples 7 to 10)

Inventive Example 7 used polishing composition Sample 4, which had the same components as used in Inventive Example 4.

The composition Sample7 of Inventive Example 8 had the same make-up as Inventive Example 7 except that the amount of polyalcohol (1) of the polishing composition of Inventive Example 7 was changed to 0.002 wt % and 0.002 wt % polyalcohol (2) was further added.

The composition Sample8 of Inventive Example 9 had the same make-up as Inventive Example 7 except that 0.004 wt % polyalcohol (2) was added to the polishing composition of Inventive Example 7.

The composition Sample9 of Inventive Example 10 had the same make-up as Inventive Example 9 except that poloxamine was deleted from the components of the polishing composition of Inventive Example 9.

The components of the polishing compositions of Inventive Examples 7 to 10 are shown in Table 4.

(Polishing Conditions)

The polishing compositions of Inventive Examples 7 to 10 were used to perform polishing under the polishing conditions provided below. A polishing device (SPP800S from Okamoto Machine Tool Works Ltd.) was used to polish silicon wafers for three minutes, where the polishing compositions of Inventive Examples 7 to 10 were supplied at a rate of 600 mL/min onto a polishing pad (SUPREME RN—H from Nitta Haas Incorporated). Each of the silicon wafers used had a diameter of 300 mm and was of a p-type semiconductor, and had the crystal orientation (100). The polishing was performed under the following conditions: the polishing and load was 0.010 MPa, the rotation speed of the polishing surface plate 50 rpm, and the rotation speed of the carrier 52 rpm.

For Inventive Examples 7 to 10 and the reference example, the number of defects and haze value were measured. The results of the measurements of the number of defects and haze value are shown in Table 4. The results of the measurements for Inventive Examples 7 to 10 are given as values relative to the results of the measurements of the number of defects and haze value for the reference example, the latter results being represented as 100.

tions in the number of defects and haze value are increased if the polishing composition further includes poloxamine.

<Evaluation Test 5> (Inventive Examples 11 to 16)

Inventive Example 11 used the polishing composition Sample 7, which had the same components as used in Inventive Example 8.

The composition Sample 10 of Inventive Example 12 had the same make-up as Inventive Example 11 except that poloxamine was deleted from the components of the polishing composition of Inventive Example 11.

The composition Sample11 of Inventive Example 13 had the same make-up as Inventive Example 12 except that the amount of polyalcohol (2) of the polishing composition of Inventive Example 12 was changed to 0.004 wt %.

The composition Sample12 of Inventive Example 14 had the same make-up as Inventive Example 12 except that the amount of polyalcohol (1) of the polishing composition of Inventive Example 12 was changed to 0.004 wt %.

TABLE 4

| Polishing composition | | Inv. Ex. 7 Sample4 | Inv. Ex. 8 Sample7 | Inv. Ex. 9 Sample8 | Inv. Ex. 10 Sample9 | Ref. Ex. Ref_1 |
|---|---|---|---|---|---|---|
| Composition of undiluted solution of polishing composition (wt %) | abrasives (colloidal silica) | 9.5 | 9.5 | 9.5 | 9.5 | commercial product NP8020H |
| | alkali (NH$_4$OH) | 0.27 | 0.27 | 0.27 | 0.27 | |
| | water-soluble polymer: modified PVA | 0.07 | 0.07 | 0.07 | 0.07 | |
| | polyalcohol (1) (EO derivative) | 0.004 | 0.002 | 0.004 | 0.004 | |
| | polyalcohol (2) (PO derivative) | — | 0.002 | 0.004 | 0.004 | |
| | non-ionic surfactant (poloxamine) | 0.014 | 0.014 | 0.014 | — | |
| Number of defects | | 16.4 | 5.1 | 5.5 | 6.9 | 100 |
| Haze value | | 97.1 | 93.1 | 90.9 | 91.4 | 100 |

Evaluation of Inventive Examples

A comparison between Inventive Examples 7 and 8, which had the same total amount of polyalcohol, reveals that Inventive Example 8, which used both polyalcohol (1) and polyalcohol (2) significantly reduced both the number of defects and haze value compared with Inventive Example 7, in which the only polyalcohol used was polyalcohol (1).

The use of both polyalcohol (1) and polyalcohol (2) as the polyalcohol reduced the number of defects and haze value presumably because, by using both an ethylene-based polyalcohol and a propylene-based polyalcohol, both the characteristic of an ethylene-based polyalcohol of significantly contributing to the reduction of the number of defects and the characteristic of a propylene-based polyalcohol of significantly contributing to the reduction of haze value were well exhibited.

Inventive Examples 8 to 9 show that an increase in the amounts of polyalcohol (1) and polyalcohol (2) contained in a polishing composition reduced haze value. Further, the numbers of defects in Inventive Examples 8 and 9 had substantially the same value.

Inventive Examples 9 to 10 show that, when a polishing composition includes two types of polyalcohol, the reduc- Inventive Example 15 used the polishing composition Sample9, which had the same components as used in Inventive Example 10.

The composition Sample 13 of Inventive Example 16 had the same make-up as Inventive Example 12 except that the amount of polyalcohol (1) of the polishing composition of Inventive Example 12 was changed to 0.010 wt % and the amount of polyalcohol (2) was changed to 0.010 wt %.

The components of the polishing compositions of Inventive Examples 11 to 16 are shown in Table 5.

The polishing compositions of Inventive Examples 11 to 16 and the reference example were used to perform polishing under the same polishing conditions as Inventive Examples 7 to 10. Then, the number of defects and the haze value were measured. The results of the measurements of the number of defects and haze value are shown in Table 5. The results of the measurements for Inventive Examples 11 to 16 are given as values relative to the results of the measurements of the number of defects and haze value for the reference example, the latter results being represented as 100.

TABLE 5

| Polishing composition | | Inv. Ex. 11 Sample7 | Inv. Ex. 12 Sample10 | Inv. Ex. 13 Sample11 | Inv. Ex. 14 Sample12 | Inv. Ex. 15 Sample9 | Inv. Ex. 18 Sample13 | Ref. Ex. Ref_1 |
|---|---|---|---|---|---|---|---|---|
| Composition of undiluted solution of polishing composition (wt %) | abrasives (colloidal silica) | 9.5 | 9.5 | 9.5 | 9.5 | 9.5 | 9.5 | commercial product NP8020H |
| | alkali ($NH_4OH$) | 0.27 | 0.27 | 0.27 | 0.27 | 0.27 | 0.27 | |
| | water-soluble polymer: modified PVA | 0.07 | 0.07 | 0.07 | 0.07 | 0.07 | 0.07 | |
| | polyalcohol (1) (EO derivative) | 0.002 | 0.002 | 0.002 | 0.004 | 0.004 | 0.01 | |
| | polyalcohol (2) (PO derivative) | 0.002 | 0.002 | 0.004 | 0.002 | 0.004 | 0.01 | |
| | non-ionic surfactant (poloxamine) | 0.014 | — | — | — | — | — | |
| Number of defects | | 10.9 | 33.6 | 9.3 | 7 | 7.1 | 3.9 | 100 |
| Haze value | | 96.4 | 98.2 | 95.8 | 97 | 95.2 | 93.9 | 100 |

Evaluation of Inventive Examples

Inventive Examples 11 and 12 show that, in a polishing composition containing polyalcohol further contains poloxamine, this increases the reductions in the number of defects and haze value. However, when the results of the discussions about Inventive Examples 2 to 3 and Comparative Example 2 in Evaluation Test 2 are also taken into account, a comparison between polyalcohol and poloxamine suggests that polyalcohol more significantly contributes to the reductions in the number of defects and haze value.

Inventive Examples 12 to 16 demonstrate that, in polishing compositions containing two types of polyalcohol, both the number of defects and haze value decrease as the total amount of polyalcohol (1) and polyalcohol (2) contained in the polishing composition increases.

A comparison between Inventive Examples 13 and 14, which had the same total amount of polyalcohol (1) and polyalcohol (2) reveals that Inventive Example 14, which had a higher proportion of ethylene-based polyalcohol (1), resulted in a smaller number of defects than Inventive Example 13, and that Inventive Example 13, which had a higher proportion of propylene-based polyalcohol (2), resulted in a smaller haze value than Inventive Example 14. That is, it verified the results of the discussions about Inventive Examples 2 and 3 in Evaluation Test 2.

<Evaluation Test 6> (Inventive Examples 17 to 20)

Inventive Example 17 used the polishing composition Sample 6, which had the same components as used in Inventive Example 6.

The composition Sample 14 of Inventive Example 18 had the same make-up as Inventive Example 2 except that 0.014 wt % poloxamine was added to the polishing composition of Inventive Example 2.

Inventive Example 19 used the polishing composition Sample 5, which had the same components as used in Inventive Example 5.

Sample 15 of Inventive Example 20 had the same make-up as Inventive Example 18 except that the amount of poloxamine of the polishing composition of Inventive Example 18 was changed to 0.021 wt %.

The components of the polishing compositions of Inventive Examples 17 to 20 are shown in Table 6.

The polishing compositions of Inventive Examples 17 to 20 and the reference example were used to perform polishing under the same polishing conditions as Inventive Examples 4 to 6. Then, the number of defects and the haze value were measured. The results of the measurements of the number of defects and haze value are shown in Table 6. The results of the measurements for Inventive Examples 17 to 20 are given as values relative to the results of the measurements of the number of defects and haze value for the reference example, the latter results being represented as 100.

TABLE 6

| Polishing composition | | Inv. Ex. 17 Sample6 | Inv. Ex. 18 Sample14 | Inv. Ex. 1 Sample5 | Inv. Ex. 20 Sample15 | Ref. Ex. Ref_1 |
|---|---|---|---|---|---|---|
| Composition of undiluted solution of polishing composition (wt %) | abrasives (colloidal silica) | 9.5 | 9.5 | 9.5 | 9.5 | commercial product NP8020H |
| | alkali ($NH_4OH$) | 0.27 | 0.27 | 0.27 | 0.27 | |
| | water-soluble polymer: modified PVA | 0.07 | 0.07 | 0.07 | 0.07 | |
| | polyalcohol (1) (EO derivative) | — | 0.0014 | 0.0021 | 0.0014 | |
| | polyalcohol (2) (PO derivative) | 0.0021 | — | — | — | |
| | non-ionic surfactant (poloxamine) | 0.014 | 0.014 | 0.014 | 0.021 | |
| Number of defects | | 31.6 | 27.4 | 15.6 | 23.4 | 100 |
| Haze value | | 94.2 | 98.8 | 98.8 | 95.3 | 100 |

Evaluation of Examples

A comparison of Inventive Examples 17 and 19 show that Inventive Example 19 containing polyalcohol (1), which is an ethylene oxide derivative, had a smaller number of defects than Inventive Example 17 containing polyalcohol (2), which is a propylene oxide derivative. On the other hand, Inventive Example 17 containing polyalcohol (2), which had a propylene oxide derivative, had a smaller haze value than Inventive Example 19 containing polyalcohol (1), which is an ethylene oxide derivative.

Inventive Examples 18 and 20 show that, as the amount of poloxamine contained in the polishing composition increases, both the number of defects and haze value decrease.

<Evaluation Test 7> (Inventive Examples 21 to 26, Comparative Example 3)

The composition Sample 16 of Inventive Example 21 had the same make-up as Inventive Example 18 except that the amount of polyalcohol (1) of the polishing composition of Inventive Example 18 was changed to 0.0007 wt %.

Inventive Example 22 used the polishing composition Sample 14 having the same components used in Inventive Example 18.

The composition Sample 17 of Inventive Example 23 had the same make-up as Inventive Example 21 except that the amount of polyalcohol (1) of the polishing composition of Inventive Example 21 was changed to 0.028 wt %.

Inventive Example 24 used the polishing composition Sample 4, which had the same components as used in Inventive Example 4.

The composition Sample 18 of Inventive Example 25 had the same make-up as Inventive Example 22 except that the amount of poloxamine of the polishing composition of Inventive Example 22 was changed to 0.007 wt %.

Inventive Example 26 used the polishing composition Sample 15, which had the same components used in Inventive Example 20.

Comparative Example 3 used the polishing composition Sample_CP2, which had the same components as used in Comparative Example 2.

The components of the polishing compositions of Inventive Examples 21 to 26 and Comparative Example 3 are shown in Table 7.

The polishing compositions of Inventive Examples 21 to 26, Comparative Example 3 and the reference example were used to perform polishing under the same polishing conditions as Inventive Examples 4 to 6. Then, the number of defects and the haze value were measured. The results of the measurements of the number of defects and haze value are shown in Table 7. The results of the measurements for Inventive Examples 21 to 26 and Comparative Example 3 are given as values relative to the results of the measurements of the number of defects and haze value for the reference example, the latter results being represented as 100.

Evaluation of Inventive Examples

A comparison between Inventive Examples 21 to 24 and Comparative Example 3 reveals that, while each polishing composition included poloxamine, Inventive Examples 21 to 24 containing polyalcohol (1) significantly reduced both the number of defects and haze value compared with Comparative Example 3.

Inventive Examples 21 to 24 show that, as the amount of polyalcohol (1) contained in the polishing composition increases, both the number of defects and haze value decrease.

Inventive Examples 22, 25 and 26 show that, as the amount of poloxamine contained in the polishing composition increases, both the number of defects and haze value decrease.

<Evaluation Test 8> (Inventive Examples 27 and 28)

The polishing composition Sample 19 of Inventive Example 27 was made by mixing 3.5 wt % abrasives, 0.1 wt % ammonium hydroxide ($NH_4OH$), 0.1 wt % modified PVA, 0.02 wt % polyalcohol (2) and 0.01 wt % poloxamine into water, and providing a total of 100 parts by weight.

The composition Sample 20 of Inventive Example 28 had the same make-up as Inventive Example 27 except that the amount of abrasives of the polishing composition of Inventive Example 27 was changed to 9.0 wt %.

The components of the polishing compositions of Inventive Examples 29 to 30 are shown in Table 8.

(Polishing Conditions)

The polishing compositions of Inventive Examples 29 to 30 were used to perform polishing under the polishing conditions provided below. A polishing device (SPP800S from Okamoto Machine Tool Works Ltd.) was used to polish silicon wafers for four minutes, where the polishing compositions of Inventive Examples 27 to 28, were supplied at a rate of 600 mL/min onto a polishing pad (SUPREME RN—H from Nitta Haas Incorporated). Each of the silicon wafers used had a diameter of 300 mm and was of a p-type semiconductor, and had the crystal orientation (100). The polishing was performed under the following conditions: the polishing load was 0.012 MPa, the rotation speed of the polishing surface plate 40 rpm, and the rotation speed of the carrier 39 rpm.

For Inventive Examples 27 to 28 and the reference example, the number of defects and haze value were measured. The results of the measurements of the number of

TABLE 7

| Polishing composition | | Inv. Ex. 21 Sample16 | Inv. Ex. 22 Sample14 | Inv. Ex. 23 Sample17 | Inv. Ex. 24 Sample4 | Inv. Ex. 25 Sample18 | Inv. Ex. 26 Sample15 | Comp. Ex. 3 Sample_CP2 | Ref. Ex. Ref_1 |
|---|---|---|---|---|---|---|---|---|---|
| Composition of undiluted solution of polishing composition (wt %) | abrasives (colloidal silica) | 9.5 | 9.5 | 9.5 | 9.5 | 9.5 | 9.5 | 9.5 | commercial product NP8020H |
| | alkali ($NH_4OH$) | 0.27 | 0.27 | 0.27 | 0.27 | 0.27 | 0.27 | 0.27 | |
| | water-soluble polymer: modified PVA | 0.07 | 0.07 | 0.07 | 0.07 | 0.07 | 0.07 | 0.07 | |
| | polyalcohol (1) (EO derivative) | 0.0007 | 0.0014 | 0.0028 | 0.004 | 0.0014 | 0.0014 | — | |
| | polyalcohol (2) (PO derivative) | — | — | — | — | — | — | — | |
| | non-ionic surfactant (poloxamine) | 0.014 | 0.014 | 0.014 | 0.014 | 0.007 | 0.021 | 0.014 | |
| Number of defects | | 37.3 | 32.5 | 25.4 | 18.6 | 44.1 | 15.7 | 57.9 | 100 |
| Haze value | | 102.2 | 99.4 | 99.4 | 96.1 | 102.2 | 95.6 | 107.2 | 100 | defects and haze value are shown in Table 8. The results of the measurements for Inventive Examples 27 to 28 are given as values relative to the results of the measurements of the number of defects and haze value for the reference example, the latter results being represented as 100.

TABLE 8

| Polishing composition | | Inv. Ex. 27 Sample19 | Inv. Ex. 28 Sample20 | Ref. Ex. Ref_1 |
|---|---|---|---|---|
| Composition of undiluted solution of polishing composition (wt %) | abrasives (colloidal silica) | 3.5 | 9 | commercial product NP8020H |
| | alkali (NH$_4$OH) | 0.1 | 0.1 | |
| | water-soluble polymer: modified PVA | 0.1 | 0.1 | |
| | polyalcohol (1) (EO derivative) | — | — | |
| | polyalcohol (2) (PO derivative) | 0.02 | 0.02 | |
| | non-ionic surfactant (poloxamine) | 0.01 | 0.01 | |
| Number of defects | | 19 | 23 | 100 |
| Haze value | | 83 | 83 | 100 |

Evaluation of Examples

Inventive Examples 27 to 28 show that, as the amount of abrasives contained in the polishing composition increases, the number of defects increases. This is presumably because an increase in the amount of abrasives increases scratches on the wafer surface caused by abrasives. On the other hand, even when the amount of abrasives increases, haze value essentially remains unchanged.

The composition Sample 22 of Inventive Example 31 had the same make-up as Inventive Example 30 except that the amount of polyalcohol (1) of the polishing composition of Inventive Example 30 was changed to 0.004 wt % and the amount of poloxamine was changed to 0.010 wt %.

Inventive Example 32 used the polishing composition Sample 4, which had the same components as used in Inventive Example 4.

The composition Sample 23 of Inventive Example 33 had the same make-up as Inventive Example 30 except that the amount of ammonium hydroxide (NH$_4$OH) of the polishing composition of Inventive Example 30 was changed to 0.50 wt %.

The composition Sample 24 of the Inventive Example 34 had the same make-up as Inventive Example 31 except that the amount of ammonium hydroxide (NH$_4$OH) of the polishing composition of Inventive Example 31 was changed to 0.50 wt %.

Comparative Example 4 used the polishing composition Sample_CP2, which had the same components as used in Comparative Example 2.

The components of the polishing compositions of Inventive Examples 29 to 34 and Comparative Example 4 are shown in Table 9.

The polishing compositions of Inventive Examples 29 to 34, Comparative Example 4 and the reference example were used to perform polishing under the same polishing conditions as Inventive Examples 4 to 6. Then, the number of defects and the haze value were measured. The results of the measurements of the number of defects and haze value are shown in Table 9. The results of the measurements for Inventive Examples 29 to 34 and Comparative Example 4 are given as values relative to the results of the measurements of the number of defects and haze value for the reference example, the latter results being represented as 100.

TABLE 9

| Polishing composition | | Inv. Ex. 29 Sample2 | Inv. Ex. 30 Sample21 | Inv. Ex. 31 Sample22 | Inv. Ex. 32 Sample4 | Inv. Ex. 33 Sample23 | Inv. Ex. 34 Sample24 | Comp. Ex. 4 Sample_CP2 | Ref. Ex. Ref_1 |
|---|---|---|---|---|---|---|---|---|---|
| Composition of undiluted solution of polishing composition (wt %) | abrasives (colloidal silica) | 9.5 | 9.5 | 9.5 | 9.5 | 9.5 | 9.5 | 9.5 | commercial product NP8020H |
| | alkali (NH$_4$OH) | 0.27 | 0.27 | 0.27 | 0.27 | 0.5 | 0.5 | 0.27 | |
| | water-soluble polymer: modified PVA | 0.07 | 0.07 | 0.07 | 0.07 | 0.07 | 0.07 | 0.07 | |
| | polyalcohol (1) (EO derivative) | 0.014 | 0.007 | 0.004 | 0.004 | 0.007 | 0.004 | — | |
| | polyalcohol (2) (PO derivative) | — | — | — | — | — | — | — | |
| | non-ionic surfactant (poloxamine) | — | 0.007 | 0.01 | 0.014 | 0.007 | 0.01 | 0.014 | |
| Number of defects | | 37 | 32 | 32 | 29 | 39 | 38 | 74 | 100 |
| Haze value | | 99 | 93 | 92 | 90 | 96 | 95 | 99 | 100 |

<Evaluation Test 9> (Inventive Examples 29 to 34, Comparative Example 4)

Inventive Example 29 used the polishing composition Sample 2, which had the same components as used in Inventive Example 2.

Sample 21 of Inventive Example 30 had the same components as Inventive Example 29 except that the amount of polyalcohol (1) of the polishing composition of Inventive Example 29 was changed to 0.007 wt % and 0.007 wt % poloxamine was added.

Evaluation of Inventive Examples

A comparison between Inventive Examples 29 and 30 and Comparative Example 4, in which the total amount of polyalcohol (1) and poloxamine was 0.014 wt %, reveals that Inventive Examples 29 and 30, which are polishing compositions containing polyalcohol, more significantly reduced both the number of defects and haze value compared with Component Example 4, which contained no polyalcohol.

A comparison between Inventive Examples 29 and 30, which had the same total amount of polyalcohol (1) and poloxamine, reveals that Inventive Example 30 containing poloxamine more significantly reduced the number of defects and haze value compared with Inventive Example 29, which contained no poloxamine.

Inventive Examples 31 and 32 show that Inventive Example 32, in which the amount of poloxamine in the polishing composition was larger than in Inventive Example 31, reduced the number of defects and haze value.

A comparison between Inventive Examples 30 and 33 and a comparison between Inventive Examples 31 and 34 reveal that, as the amount of ammonium hydroxide contained in the polishing composition increases, the number of defects and haze level increase. This is presumably because, as the amount of ammonium hydroxide increases, the etching power of ammonium hydroxide on the silicon wafer increases, producing roughness of the surface of the wafer.

It should be understood that the above-disclosed embodiments are exemplary in every respect and not limitative. It is contemplated that the scope of the present invention is not defined by the embodiments provided above but by the claims, and encompasses all the modifications within the spirit and scope equivalent to those of the claims.

INDUSTRIAL APPLICABILITY

The present invention is useful for polishing compositions.

The invention claimed is:

1. A polishing composition comprising:
    abrasives;
    at least one water-soluble polymer selected from vinyl alcohol-based resins having a 1,2-diol structural unit expressed by Formula (1) provided below;
    a polyalcohol; and
    an alkali compound,

[Formula 1]

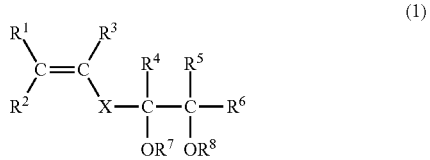

(1)

In the formula, each of $R^1$, $R^2$ and $R^3$ independently indicates a hydrogen atom or an organic group; X indicates a single bond or a joining chain;

each of $R^4$, $R^5$ and $R^6$ independently indicates a hydrogen atom or an organic group; and each of $R^7$ and $R^8$ independently indicates a hydrogen atom, and wherein the polyalcohol includes polyoxyethylene methyl glucoside and polyoxypropylene methyl glucoside.

2. The polishing composition according to claim 1, further comprising: a non-ionic surfactant.

3. The polishing composition according to claim 1, wherein the polyalcohol includes two or more types.

4. The polishing composition according to claim 1, wherein the polyalcohol is an alkylene oxide derivative of methylglucoside.

5. The polishing composition according to claim 3, wherein the polyalcohol is an alkylene oxide derivative of methylglucoside.

6. The polishing composition according to claim 2, wherein the non-ionic surfactant is a diamine compound including an alkylenediamine structure with two nitrogen atoms expressed by General Formula (2) provided below and having at least one block polyether bonded to the two nitrogen atoms of the alkylenediamine structure, where the block polyether is made of an oxyethylene group and an oxypropylene group bonded together,

[Formula 2]

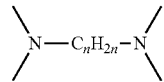

(2)

where n indicates an integer equal to or larger than 1.

* * * * *